US008007984B2

(12) United States Patent
Teltschik et al.

(10) Patent No.: US 8,007,984 B2
(45) Date of Patent: Aug. 30, 2011

(54) METHOD FOR PRODUCING FLEXOGRAPHIC PRINTING FORMS BY THERMAL DEVELOPMENT

(75) Inventors: Margit Teltschik, Karlstadt (DE);
Armin Becker, Großniedesheim (DE);
Uwe Stebani, Flörsheim-Dalsheim (DE);
Jens Schadebrodt, Mainz (DE)

(73) Assignee: XSYS Print Solutions Deutschland GmbH, Stuttgart (DE)

( * ) Notice: Subject to any disclaimer, the term of this patent is extended or adjusted under 35 U.S.C. 154(b) by 714 days.

(21) Appl. No.: 10/579,164

(22) PCT Filed: Nov. 11, 2004

(86) PCT No.: PCT/EP2004/012787
§ 371 (c)(1),
(2), (4) Date: May 29, 2007

(87) PCT Pub. No.: WO2005/050327
PCT Pub. Date: Jun. 2, 2005

(65) Prior Publication Data
US 2008/0248428 A1 Oct. 9, 2008

(30) Foreign Application Priority Data
Nov. 17, 2003 (DE) ................. 103 53 762

(51) Int. Cl.
*G03F 7/00* (2006.01)
*G03F 7/26* (2006.01)

(52) U.S. Cl. .................... 430/306; 430/286.1
(58) Field of Classification Search ............ 430/302
See application file for complete search history.

(56) References Cited

U.S. PATENT DOCUMENTS

| 3,264,103 A | 8/1966 | Cohen et al. |
| 4,460,675 A | 7/1984 | Gruetzmacher et al. |
| 4,603,367 A | 7/1986 | Müller |
| 5,175,072 A | 12/1992 | Martens |
| 5,250,389 A * | 10/1993 | Nakamura et al. .......... 430/281.1 |
| 5,259,311 A | 11/1993 | McCaughey, Jr. |
| 5,889,116 A * | 3/1999 | Suzuki et al. .................. 525/209 |
| 2006/0249239 A1* | 11/2006 | Krauss et al. .................. 156/59 |

FOREIGN PATENT DOCUMENTS

| EP | 0 084 851 | 8/1983 |
| EP | 0 136 254 | 4/1985 |
| EP | 0 468 745 | 1/1992 |
| EP | 0 469 735 | 2/1992 |
| EP | 0 525 206 | 2/1993 |
| EP | 0 654 150 | 5/1995 |
| EP | 0 654 151 | 5/1995 |
| EP | 0 778 297 | 6/1997 |
| EP | 1 069 475 | 1/2001 |
| EP | 1 070 989 | 1/2001 |
| EP | 1 072 953 | 1/2001 |
| EP | 1 239 329 | 9/2002 |
| WO | WO-96/14603 | 5/1996 |
| WO | WO-01/18604 | 3/2001 |
| WO | WO-01/88615 | 11/2001 |
| WO | WO-01/90818 | 11/2001 |
| WO | WO 0188615 A1 * | 11/2001 |

* cited by examiner

*Primary Examiner* — Cynthia H Kelly
*Assistant Examiner* — Chanceity Robinson
(74) *Attorney, Agent, or Firm* — Connolly Bove Lodge & Hutz LLP

(57) ABSTRACT

Flexographic printing plates are produced by thermal development by a process in which an imagewise exposed flexographic printing element is developed by heating and removing the softened, unpolymerized parts of the relief-forming layer, the flexographic printing element containing a styrene/butadiene block copolymer as a mixture with a plasticizer, and the proportion of butadiene which is present in 1,2-linked form being from 15 to 50% by weight, based on the block copolymer.

15 Claims, No Drawings

METHOD FOR PRODUCING FLEXOGRAPHIC PRINTING FORMS BY THERMAL DEVELOPMENT

RELATED APPLICATIONS

This application is a national stage application (under 35 U.S.C. 371) of PCT/EP2004/012787 filed Nov. 11, 2004, which claims benefit to German application 103 53 762.7 filed Nov. 17, 2003.

The present invention relates to a process for the production of flexographic printing plates by thermal development, in which an imagewise exposed flexographic printing element is developed by heating and removing the softened, unpolymerized parts of the relief-forming layer, the flexographic printing element used containing a styrene/butadiene block copolymer as a mixture with a plasticizer, and the proportion of butadiene which is present in 1,2-linked form being from 15 to 50% by weight, based on the block copolymer.

The most widely used process for the production of flexographic printing plates comprises the imagewise exposure of the photopolymerizable relief-forming layer to UV/VIS radiation through a mask created photographically or digitally. In a further process step, the exposed layer is treated with a suitable solvent or solvent mixture, the unexposed, unpolymerized parts of the relief-forming layer being dissolved while the exposed, polymerized parts are retained and form the relief of the printing plate.

However, the washout process requires a relatively long time span. Furthermore, although the polymerized components of the layer are not dissolved, they nevertheless swell in the washout medium. The plate must therefore also be carefully dried after washing out before it can be used for printing. The drying process may take several hours.

EP-A 525 206 discloses a photosensitive flexographic printing element which contains at least 50% by weight of an SBS block copolymer in which the butadiene blocks have a vinyl content of 20-50%. After exposure to light in a conventional manner, it is developed by washing out by means of a tetrachloroethylene/butanol mixture.

As an alternative to the development with solvents, U.S. Pat. Nos. 3,264,103, 5,175,072, WO 96/14603, WO 01/88615 or EP-A 1 239 329 has proposed thermal development.

No solvent is used in the thermal development. Instead, after the imagewise exposure, the relief-forming layer is brought into contact with an absorbent material and heated. The absorbent material may be a porous nonwoven, for example comprising nylon, polyester, cellulose or inorganic materials. As a result of the heating, the unpolymerized parts of the relief-forming layer liquefy and are absorbed by the nonwoven. The saturated nonwoven is then removed.

Instead of using absorbent materials for removing the liquefied material, WO 01/90818 has proposed, as an alternative, treating the exposed flexographic printing element with a hot air or liquid stream under pressure and thus removing the unpolymerized parts.

Apparatuses suitable for carrying out the thermal development have been proposed by EP-A 469 735 and WO 01/18604 and are also commercially available under the name Cyrel® Fast.

EP-A 468 745 has proposed elastomeric polyurethane as preferred materials for flexographic printing elements for thermal development. The publication mentions that some commercially available flexographic printing elements intended for development with solvents are in principle also suitable for thermal development.

WO 01/88615 states that commercially available flexographic printing elements intended for development of the solvents are frequently unsuitable for thermal development and instead proposes flexographic printing elements whose relief-forming layer has certain dynamic mechanical characteristics. In the examples of WO 01/88615, a flexographic printing element which comprises 73% by weight of binders and 12% by weight of a polybutadiene oil is used for the thermal development. The binders are a mixture of two different SIS block copolymers.

In spite of the fundamental suitability for the production of flexographic printing plates, thermal development has to date by no means replaced development by means of solvents. Particularly the production of high-resolution plates of constant quality and the production of plates having great relief heights still present problems to date.

Substantial quantity criteria for a high-quality flexographic printing plate are uniformity and cleanliness of the relief substrate and the crispness of element edges, which should be precisely formed and free of melt residues. For this purpose, it is necessary for the unpolymerized material to be capable of being liquefied very thoroughly in order to permit efficient and complete removal. Deposits remaining on the printing relief lead to reduced resolution and/or to a blurred, low-quality printed image.

Here, a person skilled in the art is faced with a typical dilemma. On the one hand, the good liquefaction of the material to be removed is of course promoted by higher temperatures. The lower the viscosity, the better and more rapidly will the liquefied polymeric material be absorbed by the nonwoven. A disadvantage, however, is that the dimensional stability of the substrate film suffers with increasing temperature. Furthermore, the printing plate is also exposed to a mechanical load in the course of pressing on the nonwoven. The combination of high temperature and mechanical load may considerably damage the relief. For example, relief elements may be buckled or even completely torn off unless they are sufficiently well anchored in the substrate. This effect is of course most evident in the case of the fine relief elements. Frequently, (a) imagewise exposure of the photopolymerizable relief-forming layer to actinic radiation,
(b) heating of the exposed flexographic printing element to a temperature of from 40 to 200° C.,
(c) removal of the softened, unpolymerized parts of the relief-forming layer with formation of a printing relief, and the elastomeric binder is at least one styrene/butadiene block copolymer having a molecular weight $M_w$ of from 80 000 to 250 000 g/mol and a styrene content of from 15 to 35% by weight, based on the binder, the proportion of butadiene which is present in 1,2-linked form being at least 20% by weight, based on the binder, and the amount of the styrene/butadiene block copolymer is from 30 to 50% by weight and that of the plasticizer is from 25 to 50% by weight, based in each case on the sum of all components of the relief-forming layer.

Surprisingly, it was found that flexographic printing plates of excellent quality are obtained by means of the novel process. The unpolymerized material can be removed thermally in an outstanding manner without residues remaining behind on the relief elements or relief elements being damaged. Even fine screens with screen spacings of 60 lines/cm are formed without errors. The thermal load on the element in the course of the process is so low that good results are obtained even with the use of conventional PET films. The exposure latitude of the flexographic printing element used according to the invention is not negative.

Regarding the present invention, the following may be stated specifically:

Examples of suitable dimensionally stable substrates for the photopolymerizable flexographic printing elements used as starting material for the process are sheets, films and conical and cylindrical sleeves of metals, such as steel, aluminum, copper or nickel, or of plastics, such as polyethylene terephthalate (PET), polyethylene naphthalate (PEN), polybutylene terephthalate, polyamide, polycarbonate, if appropriate also woven fabrics and nonwovens, such as woven glass fiber fabrics and composite materials, for example of glass fibers and plastics. Suitable dimensionally stable substrates are in particular dimensionally stable substrate films, for example polyester films, in particular PET or PEN films, or flexible metallic substrates, such as thin metal sheets or metal foils of steel, preferably of stainless steel, magnetizable spring steel, aluminum, zinc, magnesium, nickel, chromium or copper.

The flexographic printing element furthermore comprising at least one photopolymerizable, relief-forming layer. The photopolymerizable relief-forming layer may be applied directly on the substrate. However, other layers, for example adhesion-promoting layers and/or resilient lower layers, may also be present between the substrate and the relief-forming layer.

The photopolymerizable relief-forming layer comprises at least one elastomeric binder, ethylenically unsaturated monomers, a plasticizer, a photoinitiator or a photoinitiator system and optionally further components.

The elastomeric binders used according to the invention are styrene/butadiene block copolymers. These may be two-block copolymers, three-block copolymers or multiblock copolymers in which in each case a plurality of styrene and butadiene blocks alternate with one another. They may be linear, branched or star-like block copolymers. The block copolymers used according to the invention are preferably styrene/-butadiene/styrene three-block copolymers. SBS three-block copolymers, in particular commercial products, may also comprise smaller amounts of two-block copolymers as a result of the preparation. This is to be included in the term three-block copolymer.

The butadiene units in the butadiene blocks have both 1,4-linked units and 1,2-linked units. The proportion of butadiene units which are present in 1,2-linked form is at least 15% by weight, based on the binder. In the case of smaller amounts, as a rule satisfactory thermal development is no longer achieved and in particular the exposure latitudes of the flexographic printing element are unsatisfactory. In principle, all butadiene units may be 1,2-linked. However, for practical reasons, it is difficult to obtain exclusively 1,2-linked blocks. The proportion of 1,2-linked units is preferably at least 20% by weight.

The weight average molecular weight $M_w$ of the styrene/butadiene block copolymers is from 80 000 to 250 000, preferably from 120 000 to 180 000, g/mol. In the case of higher molecular weights, as a rule good thermal developability is no longer achieved and, at lower molecular weights, relief layers having good printing properties are no longer obtained. The styrene content of the binder is from 15 to 35, preferably from 20 to 25, particularly preferably from 25 to 35, % by weight, based on the binder.

The high content of 1,2-linked polybutadiene units in the binder ensures that the exposure latitude is not negative. If a styrene/butadiene block copolymer of comparable molecular weight and styrene content, but with a lower content of 1,2-linked polybutadiene units, is used, flexographic printing elements having a negative exposure latitude are obtained. Therefore, flexographic printing plates, or at least high-quality ones, cannot be produced therefrom by means of thermal development.

Methods for the preparation of styrene/butadiene block copolymers are known to a person skilled in the art, as are techniques which control the incorporation of butadiene into the polymer specifically in the direction of 1,2-linkage or 1,4-linkage. This can be flexographic printing elements have a negative exposure latitude in the case of thermal development, whereas the exposure latitude in the case of the development by means of solvents is still positive. A negative exposure latitude is undesirable in practice. Flexographic printing elements based on SIS block copolymers are commercially available. However, they are frequently comparatively soft. Flexographic printing plates for applications in which the relief layer must have a relatively great hardness can be obtained with SIS binders only with difficulty. Furthermore, flexographic printing elements based on SIS polymers have high surface tack and require at least one antiozonant as an additive for avoiding cracking due to ozone which occurs in the vicinity of UV emitters during the hardening of UV printing inks. Antiozonants used are, for example, paraffinic waxes, which however adversely affect the ink transfer with water-based inks.

Flexographic printing plates comprising SBS block copolymers as binders are more suitable for many applications. They are less tacky and require no UV stabilizer, and relief layers of greater hardness can be readily obtained. However, it has not been possible to date to subject conventional flexographic printing elements based on SBS block copolymers satisfactorily to thermal development. For example, flexographic printing elements comprising conventional SBS block copolymers have a negative exposure latitude on thermal development.

It is an object of the present invention to provide a process for the production of flexographic printing plates by means of thermal development, in which flexographic printing plates based on SBS rubbers are obtained. In particular, the SBS-based flexographic printing elements used should not have negative exposure latitude and, after the thermal development, should permit the formation of crisp-edged elements without melt residues remaining behind on the element edges.

We have found that this object is achieved by a process for the production of flexographic printing plates by thermal development, in which the starting material used is photopolymerizable flexographic printing element which comprises, arranged on top of one another, at least
   a dimensionally stable substrate,
   at least one photopolymerizable relief-forming layer, at least comprising at least one elastomeric binder, ethylenically unsaturated monomers, plasticizer and photoinitiator,
and the process comprises at least the following steps:
effected, for example, through the choice of the solvent. The incorporation preferentially takes place in the 1,2-position in polar solvents and preferentially in the 1,4-position in nonpolar solvents. Styrene/butadiene block copolymers having a high vinyl content are commercially available, for example under the name Kraton®.

Of course, it is also possible to use a mixture of a plurality of styrene/butadiene block copolymers. The amount of the styrene/butadiene block copolymer or copolymers having a high vinyl content is from 30 to 50, preferably from 35 to 50, particularly preferably from 37 to 49, % by weight.

In addition to the vinyl-rich styrene/butadiene block copolymer or copolymers, the relief-forming layer may optionally also have one or more secondary binders. Such secondary binders can be used by a person skilled in the art for precisely controlling the properties of the subsequent printing plate. For example, the resilience or the ink acceptance of the printing plate can be influenced. Furthermore, it is also possible to compensate any resulting, excessively high anisotropy by a secondary binder.

The choice of secondary binders is in principle not limited, provided that the properties of the relief-forming layer are not adversely affected thereby. Examples of suitable secondary binders include ethylene/propylene/diene terpolymers, ethylene/octene copolymers, ethylene/vinyl acetate copolymers, nitrile rubber, natural rubber, butyl rubber, polyisobutylene, polyisoprene, polybutadiene, polychloroprene, styrene/diene block copolymers, hydrogenated styrene/diene block copolymers, polyvinylbutyral or styrene/butadiene emulsion copolymers.

Styrene/butadiene block copolymers which lie outside the abovementioned definition with regard to molecular weight and/or styrene content and/or vinyl fraction are particularly suitable as secondary binders for carrying out the novel process. In particular, they may be styrene/butadiene block copolymers which contain less than 15% by weight of 1,2-linked butadiene units. Particularly preferred secondary binders are two-block copolymers, for example those having a molecular weight $M_w$ of from 150 000 to 300 000 g/mol and a styrene content of from 5 to 15% by weight. Anisotropy can be particularly effectively compensated by means of such block copolymers.

The amount of a secondary binder is determined by a person skilled in the art according to the desired properties of the printing plate. As a rule, however, it should not exceed 20, preferably 15, % by weight, based on the sum of all components of the layer. In any case, the amount used is less than that of the primary binder of the type comprising the vinyl-rich styrene/butadiene block copolymers.

The amount of all primary and secondary binders in the relief-forming layer together should not exceed 65% by weight. It is as a rule from 30 to 65% by weight. In the case of larger amounts, good thermal developability is as a rule no longer achieved, and moreover the anisotropy of the flexographic printing elements obtained becomes too high. In the case of smaller amounts, good relief layers are no longer obtained. The amount is preferably from 35 to 60, particularly preferably from 40 to 55, % by weight.

The relief-forming layer furthermore comprises at least one plasticizer. Good thermal developability is achieved by combining the binder used according to the invention with the plasticizer.

The amount of the plasticizer used is from 25 to 50% by weight. As a rule, good thermal developability is not achieved in the case of smaller amounts, and relief layers having good printing properties are no longer obtained in the case of larger amounts of plasticizer. The amount is preferably from 30 to 50, particularly preferably from 35 to 45, % by weight.

The optimum amount of plasticizer can also be influenced by the melt flow index of the binder used in each case. If the binder has a comparatively high melt flow index, the amount of plasticizer can as a rule be toward the lower limit. If the binder has a comparatively low melt flow index, a rather larger amount of plasticizer is as a rule advisable. In the case of an SBS block copolymer having in each case 30% by weight of styrene, an amount of plasticizer of from 35 to 40% by weight is advisable at a melt flow index of from 0.5 to 1 (measured at 200° C./5 kg according to DIN EN ISO 1133), and as a rule from 25 to 30% by weight are sufficient at a melt flow index of about 6.

Examples of suitable plasticizers include in particular modified and unmodified natural oils and natural resins, such as high-boiling paraffinic, naphthenic or aromatic mineral oils, synthetic oligomers or resins, such as oligostyrene, high-boiling esters, oligomeric styrene/butadiene copolymers, oligomeric α-methylstyrene/p-methylstyrene copolymers, liquid oligobutadienes, in particular those having a molecular weight of from 500 to 5 000 g/mol, liquid oligoisoprenes or liquid oligomeric acrylonitrile/butadiene copolymers or oligomeric ethylene/propylene/diene copolymers.

Vinyl-rich polybutadiene oils are preferred, in particular those in which at least 40% by weight of the incorporated butadiene units are 1,2-linked. Furthermore, high-boiling aliphatic esters and mineral oils and high-boiling, substantially paraffinic and/or naphthenic mineral oils are preferred. For example, paraffin-based solvates and special oils under the name Shell Catenex S and Shell Catenex PH are commercially available. In the case of mineral oils, a person skilled in the art makes a distinction between industrial white oils, which may still have a very low aromatics content, and medical white oils, which are substantially free of aromatics. They are commercially available, for example, under the name Shell Risella (industrial white oil) or Shell Ondina (medical white oil).

For carrying out the novel process, a mixture of at least two different plasticizers which comprises at least one polybutadiene oil is used. Particularly preferably, the mixture further comprises at least one mineral oil, in particular substantially paraffinic and/or naphthenic mineral oils.

It is of course also possible to use a mixture of two different mineral oils and two different polybutadiene oils. The weight ratio of the two groups of plasticizers is preferably from 3:1 to 1:3, preferably from 2:1 to 1:2.

For carrying out the novel process, it has generally proven useful to ensure that the total vinyl content and the relief-forming layer, i.e. the amount by weight of 1,2-bonded butadiene in the binders and plasticizers together, is at least 20% by weight, based on all components of the relief-forming layer.

The photopolymerizable relief-forming layer furthermore comprises compounds polymerizable in a known manner, or monomers. The monomers should be compatible with the olefin/(meth)acrylate copolymer and have at least one polymerizable, ethylenically unsaturated double bond. Esters or amides of acrylic acid or methacrylic acid with mono- or polyfunctional alcohols, amines, amino alcohols or hydroxyethers and hydroxyesters, esters of fumaric or maleic acid or allyl compounds have proven particularly advantageous. Examples of suitable monomers are butyl acrylate, 2-ethylhexyl acrylate, lauryl acrylate, 1,4-butanediol diacrylate, 1,6-hexanediol diacrylate, 1,6-hexanediol dimethacrylate, 1,9-nonanediol diacrylate, trimethylolpropane tri(meth)acrylate, dioctyl fumarate and N-dodecylmaleimide. The amount of monomers in the relief-forming layer is as a rule from 4.9 to 30, preferably from 4.9 to 20, % by weight, based on the amount of all components.

The photopolymerizable relief-forming layer furthermore has, in a manner known in principle, a photoinitiator or a photoinitiator system. Examples of suitable initiators are benzoin or benzoin derivatives, such as methylbenzoin or benzoin ether, benzil derivatives, such as benzil ketals, acylarylphosphine oxides, acylarylphosphinic acid esters, polynuclear quinones or benzophenones. The amount of photoinitiator in the relief-forming layer is as a rule from 0.1 to 5% by weight, based on the amount of all components of the relief-forming layer.

The relief-forming layer may optionally comprise further components, for example thermal polymerization inhibitors, dyes, pigments, photochromic additives or antioxidants. As a rule, however, not more than 10, preferably not more than 5, % by weight, based on the sum of all components of the layer, should be used.

The photopolymerizable relief-forming layer may also comprise a plurality of photopolymerizable layers one on top of the other, which have an identical or virtually identical composition or different compositions. A multilayer structure has the advantage that the properties of the surface of the printing plate, for example ink transfer, can be changed without the properties of the printing plate which are typical for flexographic printing, for example hardness or resilience, being influenced. Surface properties and layer properties can thus be changed independently of one another in order to achieve an optimum printed copy.

It is frequently advantageous for printing if the surface of the relief layer is harder than the relief layer underneath. This can advantageously be achieved if, in the case of the composition of the upper layer, a person skilled in the art tends toward the lower limit of the disclosed ranges with respect to the plasticizer content and toward the upper limit in the case of the binder content, and adopts the converse procedure in the case of the composition of the lower layer. For example, the upper layer may contain from 25 to 30% by weight of plasticizer and the lower layer from 40 to 50% by weight. Typically, such a hard upper layer, if present, has a thickness of not more than 0.1 mm, preferably 0.01-0.1 mm, without it being intended to restrict the invention thereto.

The top layer can, however, also have a composition differing from the novel composition, provided that no adverse effects are observed in the course of the thermal development.

The flexographic printing element may optionally comprise even further layers in addition to the relief-forming layer.

Examples of such layers include an elastomeric lower layer comprising another formulation, which is present between the substrate and the relief-forming layer or layers. By means of such lower layers, the mechanical properties of the flexographic printing plates can be changed without influencing the properties of the actual printing relief layer.

Resilient substructures which are present under the dimensionally stable substrate of the flexographic printing element, i.e. on that side of the substrate which faces away from the relief-forming layer, serve the same purpose.

Further examples include adhesion-promoting layers which bond the substrate to layers present on top or different layers to one another.

The thickness of the relief-forming layer or layers is determined by a person skilled in the art according to the desired purpose of the flexographic printing plate and is as a rule from 0.5 to 7 mm, preferably from 0.5 to 5 mm, particularly preferably from 0.6 to 2.5 mm.

The photopolymerizable flexographic printing element may furthermore have a nontacky top layer transparent to light. Such top layers are also known as release layers. They make it easier to peel off any protective film present before the flexographic printing element is used and thus avoid damage to the relief-forming layer. They furthermore facilitate the positioning and removal of the photographic negative for imaging. Release layers are formed by a polymer forming strong films and any additives contained therein. Examples of suitable polymers forming strong films are polyamides, completely or partly hydrolyzed polyvinyl acetates or polyethylene oxide/vinyl acetate graft polymers. In general, the release layers are from 0.2 to 25, preferably from 2 to 20, μm thick.

The flexographic printing element used as starting material can optionally also be protected from damage by a protective film, for example a PET protective film, which is present in each case on the uppermost layer of the flexographic printing element, i.e. as a rule on the release layer. If the photosensitive flexographic printing element has a protective film, this must be peeled off before the novel process is carried out.

The production of the novel flexographic printing element has no special features at all and can be effected by methods known in principle to a person skilled in the art, for example by kneading the components and shaping the layer by pressing, by means of extrusion and calendering between substrate film and cover sheet or by casting the dissolved components of the layer on the protective film, generally covered by a release layer, or the dimensionally stable substrate. The production is preferably effected by means of extrusion and calendering between substrate film and cover sheet.

In a preferred embodiment, the styrene/butadiene block copolymer or all binders is or are first processed with a portion of the plasticizer in a suitable mixing unit to give a homogeneous material. The material obtained is then further processed in a second step in an extruder together with the other components of the layer and the remainder of the plasticizer. Advantageously, a larger amount of plasticizer can thus also be incorporated over a short extruder length and moreover a particularly homogeneous incorporation of the plasticizer can be achieved. In addition, the residence time of the polymeric material in the hot zone of the extruder are reduced. This procedure has proven useful particularly with the use of plasticizers based on mineral oils. If the preferred mixture comprising mineral oils and polybutadiene oils is used, the mineral oil is preferably incorporated into the block copolymer beforehand while the polybutadiene oil is not added until later. The procedure described and involving precompounding also has the advantage that the production can be effected at lower extruder capacity utilization and lower thermal load in the extruder.

The flexographic printing element disclosed above is intended for conventional imaging by means of photographic masks. In a further embodiment of the invention, it may also be a digitally imageable flexographic printing element. Here, the flexographic element has an additional digitally imageable layer. This may be present on the transparent release layer, but it is also possible to dispense with the release layer in the presence of digitally imageable layers.

The digitally imageable layer is preferably a layer selected from the group consisting of the IR-ablative layers, inkjet layers and thermographic layers.

IR-ablative layers or masks are opaque for the wavelength of actinic light and usually comprise a film-forming thermally decomposable binder and at least one IR absorber, for example carbon black. Carbon black also ensures the layer is opaque. Suitable binders are both binders, for example polyamides or nitrocellulose, which are soluble in organic media, and binders soluble in aqueous media, for example polyvinyl alcohol or polyvinyl alcohol/polyethylene glycol graft copolymers. A mask can be recorded in the IR-ablative layer by means of an IR laser, i.e. the layer is decomposed and ablated in the parts where the laser beam strikes it. Imagewise exposure to actinic light can be effected through the resulting mask. Examples of the imaging of flexographic printing elements using IR-ablative masks are disclosed, for example, in EP-A 654 150 or EP-A 1 069 475.

In the case of inkjet layers, a transparent layer recordable on using inkjet inks, for example a gelatin layer, is applied. This can be printed on by means of inkjet printers using opaque inks. Examples are disclosed in EP-A 1 072 953.

Thermographic layers are transparent layers which contain substances which become black under the influence of heat. Such layers comprise, for example, a binder and an inorganic or organic silver salt and can be imaged by means of a printer having a thermal printing head. Examples are disclosed in EP-A 1 070 989.

The digitally imageable layer may be a peel-off layer, as disclosed, for example, by EP-A 654 151.

In a preferred embodiment, the digitally imageable layers are soluble in water or predominantly aqueous solvent mixtures.

The digitally imageable layers can be cast on the photopolymerizable layer or the release layer in a manner known in principle.

For carrying out the novel process, the flexographic printing element is used as starting material. If the flexographic printing element comprises a protective film, this is first peeled off. In the first process steps, the flexographic printing element is exposed imagewise and then thermally developed in further process steps.

In process step (a), the photopolymerizable relief-forming layer is first exposed imagewise to actinic radiation. The imagewise exposure can be effected by means of methods known in principle.

In process step (a) of the conventional process, a photographic mask is placed on top for imaging of the relief-forming layer. The flexographic printing element is then exposed to actinic light through the mask placed on top.

Suitable actinic, i.e. chemically active, light is known to be in particular UVA or UV/VIS radiation. As a result of the exposure, the photopolymerizable layer is crosslinked in the parts not covered. In order to be able to place the photographic negative on top in a trouble-free manner, the exposure can be carried out in a known manner using a vacuum film or a vacuum printing frame or under a glass sheet.

If the dimensionally stable substrate is transparent, the flexographic printing element can optionally be exposed to actinic light from the back in a process step preceding (a). By means of such a step, the relief height can be determined, and it contributes to better anchoring of the relief elements.

In the process steps (b) and (c) of the novel process, the imagewise exposed flexographic printing element is thermally developed. The two process steps can be carried out in succession or simultaneously.

In process step (b), the flexographic printing element is heated so that the unpolymerized parts of the relief-forming layer soften, liquefy or melt. A person skilled in the art is conscious of the fact that the term melt with regard to the material comprising polymer, plasticizer, monomer, photoinitiator and, if appropriate, other additives cannot be defined as precisely as in the case of pure, low molecular weight substances. What is meant here is that the viscosity of the material is to be reduced to such an extent that, in process step (c), it can be absorbed by a nonwoven or removed in another manner.

In step (b), the flexographic printing element is first heated for one or more short time phases to a temperature which is sufficiently high to liquefy the unpolymerized parts of the layer to a sufficient extent, but without damaging the polymerized parts of the layer. In general, a temperature of from 40 to 200° C. is required for this purpose. The flexographic printing element is preferably heated to a temperature of from 80 to 170° C.

The heating can be effected, for example, by irradiation with a heat source, for example by means of an IR emitter. Further examples include immersion in heat baths, heating by means of hot air or liquid streams or bringing the flexographic printing element into contact with hot surfaces, without it being intended to restrict the invention thereto. A combination of a plurality of methods may also be used. The flexographic printing element is preferably heated from the front. As a result, the surface of the relief-forming layer usually has a higher temperature than those parts of the layer which are located underneath the surface.

In step (c), the softened, unpolymerized parts of the relief-forming layer are removed. The polymerized parts remain behind on the substrate, with the result that the printing relief forms.

Step (c) can be carried out, for example, by bringing the heated relief-forming layer into contact with an absorbent material. The heated, liquefied, unpolymerized parts of the relief-forming layer are absorbed here by the absorbent material. In order to achieve very efficient absorption, very intimate contact between the absorbent material and the surface of the flexographic printing element should be established. For example, the absorbent material can be placed on the surface and then pressed on. After saturation of the absorbent material with the polymeric material, the absorbent material is peeled off again from the still warm flexographic printing plate. In order to ensure complete removal of the softened material, it is usually advisable to repeat this process with fresh absorbent material until all liquefied material has been removed. Suitable absorbent materials are suitable porous materials, for example nonwovens of nylon, polyester or cellulose. Further details for carrying out step (c) are disclosed in WO 01/88615, page 15, line 5 to page 17, line 2, which is hereby incorporated by reference.

The steps (b) and (c) can be carried out in succession but as a rule are carried out substantially simultaneously. The layer may be covered with the nonwoven during the heating, and as a rule it is also necessary to supply heat during step (c) in order to avoid undesired cooling of the flexographic printing element and hence incomplete removal of the polymeric material.

In an alternative embodiment for process step (c), the removal is effected by processing the heated flexographic printing plate with a hot air or liquid stream under pressure. For example, a jet of steam under pressure can be directed at the flexographic printing element from the top. Firstly, the hot stream of steam ensures heating of the flexographic printing element and softening of the unpolymerized parts of the relief-forming layer. The mechanical energy of the jet ensures separation of the liquefied material from the polymerized parts. Further details are disclosed in WO 01/90818, page 3, lines 5 to 16.

The printing plate obtained by thermal development can optionally also be aftertreated. It can, for example, be subsequently exposed uniformly to actinic light. It can furthermore be rendered nontacky on the surface in a manner known in principle by means of $Br_2$ solution or by means of exposure to UV-C light.

With the use of flexographic printing elements having digitally imageable layers, the novel process is very similar to that described above. Instead of the use of a photographic mask, the digitally imageable layer is imaged by means of the technique required in each case, in a step preceding process step (a), and hence the mask is produced, so to speak, in situ on the relief-forming layer.

With the use of IR-ablative masks, the IR-ablative layer is removed partly—according to the desired image—with the aid of an IR laser. Those parts which are to be subsequently crosslinked and form the relief elements are bared here. With the use of inkjet layers or thermographic layers, the digitally imageable layer is printed on by means of inkjet printers or thermographic printers in those parts which are not to be crosslinked in the course of the exposure.

After the production of a mask from the digitally imageable layer, exposure to actinic light is effected as with the use of a photographic mask. A vacuum frame for exposure to light is not required. Exposure is preferably effected by means of a flat-bed exposure unit in air.

The exposed flexographic printing element can be used as such, i.e. including the digitally imageable layer or the residues thereof, for thermal development.

In a preferred embodiment, the digitally imageable layer is removed in a process step preceding process step (b). The prior detachment of the digitally imageable layer saves time during the thermal development and prevents contamination of the thermal processing apparatus with components of the mask layer. The removal of the digitally imageable layer can be effected, for example, by peeling off or by detachment by means of a suitable solvent. In a particularly preferred embodiment, a water-soluble or at least water-swellable digitally imageable layer is used. The digitally imageable layer or the residues thereof can be detached with water or predominantly aqueous solvents after the imaging and exposure to actinic light. The detachment can optionally be promoted by gentle mechanical treatment, for example by brushing. Since the styrene/butadiene block copolymers used according to the invention are soluble only in organic solvents or solvent mixtures, the unpolymerized parts of the relief-forming layer are not dissolved, nor are the polymerized parts swollen. The flexographic printing element pretreated in this manner can therefore be further processed directly thereafter without prior drying being necessary.

The flexographic printing elements used according to the invention can be developed not only thermally but also in a conventional manner by means of washout media. In the conventional development, the exposed flexographic printing element is developed in a known manner with an organic solvent or solvent mixture after the imagewise exposure of the flexographic printing element. This possibility of multiple use is economically advantageous both for producers and for users.

The flexographic printing elements used according to the invention may furthermore be used as starting materials for the production of flexographic printing plates by means of direct laser engraving. For this purpose, a flexographic printing element which has no digitally imageable layer is used. This is crosslinked uniformly, i.e. without placing a mask on top, by means of actinic light in a first process step. The printing relief can then be engraved directly by means of a $CO_2$ laser into the uniformly crosslinked relief-forming layer. The crosslinked layer is thermally decomposed in the parts where the laser strikes it. Further details of the direct laser engraving technique for the production of flexographic printing plates are disclosed, for example, in EP-A 136 254 and U.S. Pat. No. 5,259,311.

By means of the novel process, flexographic printing plates are obtained by means of thermal development in a quality unknown to date. Fine positive elements, such as screens, lines and fine scripts, are crisply formed. The exposure latitude is positive. The flexographic printing elements used for the process can be produced particularly economically by means of extrusion at relatively low temperatures. They are furthermore suitable for other applications.

The examples which follow illustrate the invention:

Production of the Flexographic Printing Elements Used, General Method

The flexographic printing elements used for the novel process are produced by the conventional method. In the examples below, the photopolymerizable material was extruded, discharged through a slot die and calendered between a substrate layer and a cover element. This process is described in detail in EP-B 084 851.

In the examples mentioned below, the cover element consisted of a PET cover sheet which had been coated with a release layer about 3 μm thick and comprising about 80% by weight of polyamide (Macromelt® 6900, from Henkel) and about 20% by weight of a styrene/acrylate copolymer (Joncryl® 586, from Johnson Polymer Inc.). The release layer remains on the photopolymerizable material after the cover sheet has been peeled off. It prevents adhesion of the photographic negative during the processing and protects the processor from direct contact with monomers and other reactive ingredients.

The extrusion unit used was a twin-screw extruder (ZSK 53, Werner & Pfleiderer), at a throughput of 30 kg/h. The calendering was effected between two calender rolls heated to 90° C., the substrate being passed over the upper calender roll and the cover element over the lower calender roll.

The sandwich composite obtained was transported over a suction belt, cooled and converted into the final form.

Details of the composition of the photopolymerizable material, production parameters and the substrate and cover elements used are described in the respective examples.

Imagewise Exposure of the Flexographic Printing Elements

Before the imagewise exposure, uniform exposure through the back was carried out for the time span stated in the examples.

The imagewise exposure of the flexographic printing element was effected by the generally customary method through a negative by means of UV light for the duration stated in each case, the cover sheet of the photopolymerizable printing plate being removed before the imagewise exposure. After the photographic negative had been placed on top, the imagewise exposure was effected through a vacuum film which, at a pressure of about 200 mbar, fixes the photographic negative uniformly on the surface of the flexographic printing element and reduces the oxygen content during the exposure.

The exposure unit used for the imagewise exposure and the uniform exposure through the back was a nyloflex® F III exposure unit (BASF Drucksysteme GmbH, Stuttgart).

Development of the Flexoqraphic Printing Elements a) Development of the Flexographic Printing Element by Means of Developer Solutions The development of the imagewise exposed flexographic printing elements by means of washout media was carried out using a commercial washout medium for flexographic printing plates (nylosolv® II, BASF Drucksysteme GmbH) in a likewise commercially available washout unit (nyloflex® continuous-flow water F III, BASF Drucksysteme GmbH).

After the development process by means of developer solutions, the still swollen flexographic printing elements were dried in a through-circulation dryer at 60° C. until the required layer thickness for the printing process was reached. This process took 2-3 hours, depending on the composition of the printing plate.

b) Thermal Development of the Flexoqraphic Printing Elements

The thermal development of the imagewise exposed flexographic printing elements was effected similarly to the process disclosed in WO 01/88615, with the aid of a commercially available processing unit of the type FAST 1000 TDe Processor (DuPont Cyrel®). Here, the imagewise exposed printing plate was clamped on a drum heated to 23° C. In the course of a complete drum revolution, the printing plate was first heated from the surface with the aid of infrared emitters. A simultaneously transported nonwoven was pressed against the heated flexographic printing plate by means of a heated roll and took up the heated, unpolymerized components of the flexographic printing plate. A drum revolution is defined as 1 cycle. The temperature of the heated, nonwoven-carrying roll was 163° C. In the course of several cycles, the intensity of the IR exposure and the contact pressure of the nonwoven against the flexographic printing plate was reduced stepwise by about 40% altogether. The plate was removed after the number of processing cycles stated in the examples.

Aftertreatment of the Developed Flexographic Printing Elements

After the development process, the flexographic printing elements described below were first exposed uniformly to UVA light for 10 minutes with the aid of a nyloflex® F III exposure unit (BASF Drucksysteme GmbH, Stuttgart). The aftertreatment serves for chemically converting remaining reactive components of the printing plate.

The surface of the printing plate was then aftertreated in a UVC exposure unit for 10 minutes. A nontacky printing surface was obtained thereby.

Determination of the Exposure Latitude

The test negatives used for the imagewise exposure contained positive elements (raised image elements) and negative elements (nonprinting elements surrounded by solid areas). After the complete processing of the printing plate, the image element must fulfill certain limiting criteria in order to be rated as correctly formed. In the table below, the image elements used for determining the exposure latitude are mentioned together with the element dimensions and limiting criteria.

| Image element | Element dimensions | Limiting criterion |
|---|---|---|
| Positive elements | | |
| Positive dot | 200 μm (diameter) | Formed without errors, surface homogeneous |
| Grid | 55 μm (line width) | Formed without errors, without waves |
| Positive line | 100 μm (line width) | Formed without errors, without waves |
| 2% screen | 2% screen with 60 lines/cm | Completely formed, no breaks |
| Negative elements | | |
| Negative dot | 400 μm (diameter) | Depth at least 70 μm |
| Negative line | 2 mm (line width) | Depth at least 500 μm |

The imagewise exposure is effected by means of 8 test negatives. Beginning with an exposure time of 4 minutes, the printing plate is exposed through the test negatives with an exposure time increasing by 2 minutes in each case, i.e. in steps of 4, 6, 8, 10, 12, 14, 16 and 18 minutes altogether. For each image element, that exposure time at which the formation is correct for the first time (positive elements) or the limiting criterion is just fulfilled (negative elements) is determined.

The lower exposure limit (LEL) is the maximum of the exposure times of all positive elements, and the upper exposure limit (UEL) is the minimum of the exposure times of all negative elements. The exposure latitude (ELAT) is the difference UEL−LEL. A very large, positive exposure latitude is desirable.

Determination of the Anisotropy Factor

A flexographic printing plate should behave isotropically, i.e. the mechanical and printing properties should be independent of the orientation of the flexographic printing element in the printing press. A measure of the degree of anisotropy is the anisotropy factor AF:

$$AF = \sigma_{MD}(125\%)/\sigma_{TD}(125\%) \text{ if } \sigma_{MD}(125\%) > \sigma_{TD}(125\%)$$

$$AF = \sigma_{TD}(125\%)/\sigma_{MD}(125\%) \text{ if } \sigma_{TD}(125\%) > \sigma_{MD}(125\%)$$

where $\sigma_{MD}(125\%)$=tensile stress in extrusion direction at 125% extension $\sigma_{TD}(125\%)$=tensile stress transverse to extrusion direction at 125% extension With the present definition, AF is always $\geq 1$. The deviation from the ideal value of 1 is a measure of the anisotropy of the flexographic printing element. The tensile stresses were determined using a tensile tester of the type Zwick Z2.5/TN1S (Zwick GmbH & Co. KG).

The flexographic printing element is considered to be substantially isotropic in practice if the anisotropy factor fulfills the condition AF$\leq$1.2.

Starting Materials Used

| | |
|---|---|
| Kraton® D-1192: | SBS block copolymer (Kraton Polymers) $M_W \approx$ 150 000 g/mol, 10% of SB two-block fraction, 30% of styrene units, 42% of 1,4-butadiene units, 28% of 1,2-butadiene units |
| Kraton® D-4150: | SBS block copolymer comprising 33% of liquid paraffin (Kraton Polymers) $M_W \approx$ 170 000 g/mol, 17% of SB two-block fraction, 31% of styrene units, 62% of 1,4-butadiene units, 7% of 1,2-butadiene units |
| Kraton® D-1102: | SBS block copolymer (Kraton Polymers) $M_W \approx$ 125 000 g/mol, 17% of SB two-block fraction, 30% of styrene units, 63% of 1,4-butadiene units, 7% of 1,2-butadiene units |
| Kraton® D-1161: | SIS block copolymer (Kraton Polymers) $M_W \approx$ 210 000 g/mol, 17% of SB two-block fraction, 15% of styrene units, 78% of 1,4-isoprene units, 7% of 4,3-isoprene units |
| Kraton® DX-1000: | SB block copolymer (Kraton Polymers) $M_W \approx$ 230 000 g/mol, 100% of SB two-block fraction, 9% of styrene units, 84% of 1,4-butadiene units, 7% of 1,2-butadiene units |
| Nisso® PB B-1000 | Oligomeric polybutadiene oil (Nippon Soda) $M_N \approx$ 1 050 g/mol, 15% of 1,4-butadiene units, 85% of 1,2-butadiene units |
| Lithene® PH | Oligomeric polybutadiene oil (Chemetall) $M_N \approx$ 2 600 g/mol, 55% of 1,4-butadiene units, 45% of 1,2-butadiene units |
| Ondina® 934 | Medical white oil (Shell) |
| Laromer® HDDA: | 1,6-Hexanediol diacrylate (BASF) |
| HDDMA: | 1,6-Hexanediol dimethacrylate (Röhm GmbH & Co. KG) |
| Lucirin® BDK | Benzil dimethyl ketal (BASF) |
| Kerobit® TBK | 2,6-di-tert-butyl-p-cresol (Raschig) |

EXAMPLE 1

First, a precompound was prepared from 67% by weight of Kraton D-1192 and 33% by weight of Ondina 934 in a Diosna mixer (type V25 with shredder, from Dierks & Söhne GmbH). This compound comprising vinyl-rich SBS block copolymer and mineral oil plasticizer is referred to as Kraton D-1192 compound.

After the extrusion process described above, a flexographic printing element of the following composition/structure was produced:

| Example 1 | | |
|---|---|---|
| Composition | | |
| Kraton ® D-1192 compound | % by wt. | 66.950 |
| Lithene ® PH (plasticizer - 45% of vinyl) | % by wt. | 20.000 |
| Laromer ® HDDA | % by wt. | 10.000 |
| Lucirin ® BDK | % by wt. | 2.000 |
| Kerobit ® TBK | % by wt. | 1.000 |
| Dyes | % by wt. | 0.050 |
| Sum of starting materials ($\Sigma_{tot}$) | % by wt. | 100.000 |
| Calculated data for the composition | | |
| Sum of binders, based on $\Sigma_{tot}$ | % by wt. | 45 |
| Proportion of vinyl groups in main binder | % by wt. | 28 |
| Sum of plasticizer, based on $\Sigma_{tot}$ | % by wt. | 42 |
| Sum of all vinyl groups, based on $\Sigma_{tot}$ | % by wt. | 22 |
| Components of the laminate | | |
| Substrate | 175 μm | PET film: Melinex ® 740 |
| Substrate coating | 7 μm | Adhesive coating containing UV absorber |
| Photopolymerizable layer | 980 μm | According to composition |
| Cover sheet | 125 μm | PET film: Lumirror ® X 43 |
| Substrate for cover sheet | 3 μm | Macromelt ® 6900 + Joncryl ® 586 |
| Total thickness (with cover element) | 1290 μm | |
| Plate layer thickness (without cover element) | 1140 μm | |
| Anisotropy factor AF | | 1.0 |

The laminate obtained was converted into at least 10 plates measuring 60×40 cm and stored away from light for 1 week at 22° C. before the further processing.

EXAMPLE 2

A flexographic printing element of the following composition/structure was produced analogously to example 1 by means of an extrusion process:

| Example 2 | | |
|---|---|---|
| Composition | | |
| Kraton ® D-1192 compound | % by wt. | 56.950 |
| Kraton ® DX-1000 (binder 2) | % by wt. | 10.000 |
| Nisso ® PB-B 1000 (plasticizer - 85% of vinyl) | % by wt. | 20.000 |
| Laromer ® HDDA | % by wt. | 10.000 |
| Lucirin ® BDK | % by wt. | 2.000 |
| Kerobit ® TBK | % by wt. | 1.000 |
| Dyes | % by wt. | 0.050 |
| Sum of starting materials ($\Sigma_{tot}$) | % by wt. | 100.000 |
| Calculated data for the composition | | |
| Sum of binders, based on $\Sigma_{tot}$ | % by wt. | 48 |
| Proportion of vinyl groups of main binder | % by wt. | 28 |
| Proportion of vinyl groups of binder 2 | % by wt. | 7 |
| Sum of plasticizers, based on $\Sigma_{tot}$ | % by wt. | 39 |
| Sum of all vinyl groups, based on $\Sigma_{tot}$ | % by wt. | 28 |
| Components of the laminate | | |
| Substrate | 175 μm | PET film: Melinex ® 740 |
| Substrate coating | 7 μm | Adhesive coating containing UV absorber |
| Photopolymerizable layer | 980 μm | According to composition |
| Cover sheet | 125 μm | PET film: Lumirror ® X 43 |
| Substrate of cover sheet | 3 μm | Macromelt ® 6900 + Joncryl ® 586 |
| Total layer thickness (with cover element) | 1290 μm | |
| Plate layer thickness (without cover element) | 1140 μm | |
| Anisotropy factor AF | | 1.1 |

The laminate obtained was converted into at least 10 plates measuring 60×40 cm and stored away from light for 1 week at 22° C. before the further processing.

EXAMPLE C3

Comparative Example

Binder Content too High

A flexographic printing element of the following composition/structure was produced analogously to example 1 by means of an extrusion process:

| Example C3 (comparative example) | | |
|---|---|---|
| Composition | | |
| Kraton ® D-1192 compound | % by wt. | 76.950 |
| Lithene ® PH (plasticizer - 45% of vinyl) | % by wt. | 10.000 |
| Laromer ® HDDA | % by wt. | 10.000 |
| Lucirin ® BDK | % by wt. | 2.000 |
| Kerobit ® TBK | % by wt. | 1.000 |
| Dyes | % by wt. | 0.050 |
| Sum of starting materials ($\Sigma_{tot}$) | % by wt. | 100.000 |
| Calculated data for the composition | | |
| Sum of binders, based on $\Sigma_{tot}$ | % by wt. | 52 |
| Proportion of vinyl groups of main binder | % by wt. | 28 |
| Sum of plasticizers, based on $\Sigma_{tot}$ | % by wt. | 36 |
| Sum of all vinyl groups, based on $\Sigma_{tot}$ | % by wt. | 19 |
| Components of the laminate | | |
| Substrate | 175 μm | PET film: Melinex ® 740 |
| Substrate coating | 7 μm | Adhesive coating containing UV absorber |
| Photopolymerizable layer | 980 μm | According to composition |
| Cover sheet | 125 μm | PET film: Lumirror ® X 43 |
| Substrate of cover sheet | 3 μm | Macromelt ® 6900 + Joncryl ® 586 |
| Total layer thickness (with cover element) | 1290 μm | |
| Plate layer thickness (without cover element) | 1140 μm | |
| Anisotropy factor AF | | 4.2 |

The laminate obtained was converted into at least 10 plates measuring 60×40 cm and stored away from light for 1 week at 22° C. before the further processing. Owing to the very high anisotropy factor of 4.2, the flexographic printing element is unsuitable for printing in practice.

EXAMPLE C4

Comparative Example

Binder Content Too High

A flexographic printing element of the following composition/structure was produced analogously to example 1 by means of an extrusion process:

| Example C4 (comparative example) | | |
|---|---|---|
| Composition | | |
| Kraton ® D-1192 compound | % by wt. | 46.950 |
| Kraton ® DX-1000 (binder 2) | % by wt. | 20.000 |
| Lithene ® PH (plasticizer - 45% of vinyl) | % by wt. | 20.000 |
| Laromer ® HDDA | % by wt. | 10.000 |
| Lucirin ® BDK | % by wt. | 2.000 |
| Kerobit ® TBK | % by wt. | 1.000 |
| Dyes | % by wt. | 30.050 |
| Sum of starting materials ($\Sigma_{tot}$) | % by wt. | 100.000 |
| Calculated data for the composition | | |
| Sum of binders, based on $\Sigma_{tot}$ | % by wt. | 51 |
| Proportion of vinyl groups of main binder | % by wt. | 28 |
| Proportion of vinyl groups of binder 2 | % by wt. | 7 |
| Sum of plasticizers, based on $\Sigma_{tot}$ | % by wt. | 36 |
| Sum of all vinyl groups, based on $\Sigma_{tot}$ | % by wt. | 19 |
| Components of the laminate | | |
| Substrate | 175 μm | PET film: Melinex ® 740 |
| Substrate coating | 7 μm | Adhesive coating containing UV absorber |
| Photopolymerizable layer | 980 μm | According to composition |
| Cover sheet | 125 μm | PET film: Lumirror ® X 43 |
| Substrate of cover sheet | 3 μm | Macromelt ® 6900 + Joncryl ® 586 |
| Total layer thickness (with cover element) | 1290 μm | |
| Plate layer thickness (without cover element) | 1140 μm | |
| Anisotropy factor AF | | 1.4 |

The laminate obtained was converted into at least 10 plates measuring 60×40 cm and stored away from light for 1 week at 22° C. before the further processing. Owing to the very high anisotropy factor of 1.4, the flexographic printing element is less suitable for printing in practice.

EXAMPLE C5

Comparative Example

Binder Content too Low

A flexographic printing element of the following composition/structure was produced analogously to example 1 by means of an extrusion process:

| Example C5 (comparative example) | | |
|---|---|---|
| Composition | | |
| Kraton ® D-4150 (33% of mineral oil) | % by wt. | 56.950 |
| Kraton ® DX-1000 (binder 2) | % by wt. | 10.000 |
| Lithene ® PH (plasticizer - 45% of vinyl) | % by wt. | 20.000 |
| Laromer ® HDDA | % by wt. | 10.000 |
| Lucirin ® BDK | % by wt. | 2.000 |
| Kerobit ® TBK | % by wt. | 1.000 |
| Dyes | % by wt. | 0.050 |
| Sum of starting materials ($\Sigma_{tot}$) | % by wt. | 100.000 |
| Calculated data for the composition | | |
| Sum of binders, based on $\Sigma_{tot}$ | % by wt. | 48 |
| Proportion of vinyl groups of main binder | % by wt. | 7 |
| Proportion of vinyl groups of binder 2 | % by wt. | 7 |
| Sum of plasticizers, based on $\Sigma_{tot}$ | % by wt. | 39 |
| Sum of all vinyl groups, based on $\Sigma_{tot}$ | % by wt. | 12 |
| Components of the laminate | | |
| Substrate | 175 μm | PET film: Melinex ® 740 |
| Substrate coating | 7 μm | Adhesive coating containing UV absorber |
| Photopolymerizable layer | 980 μm | According to composition |
| Cover sheet | 125 μm | PET film: Lumirror ® X 43 |
| Substrate of cover sheet | 3 μm | Macromelt ® 6900 + Joncryl ® 586 |
| Total layer thickness (with cover element) | 1290 μm | |
| Plate layer thickness (without cover element) | 1140 μm | |
| Anisotropy factor AF | | 1.1 |

The laminate obtained was converted into at least 10 plates measuring 60×40 cm and stored away from light for 1 week at 22° C. before the further processing.

EXAMPLE C6

Comparative Example

Binder Content Too Low

A flexographic printing element of the following composition/structure was produced analogously to example 1 by means of an extrusion process:

| Example C6 (comparative example) | | |
|---|---|---|
| Composition | | |
| Kraton ® D-1102 | % by wt. | 54.950 |
| Lithene ® PH (plasticizer - 45% of vinyl) | % by wt. | 32.000 |
| Laromer ® HDDA | % by wt. | 10.000 |
| Lucirin ® BDK | % by wt. | 2.000 |
| Kerobit ® TBK | % by wt. | 1.000 |
| Dyes | % by wt. | 0.050 |
| Sum of starting materials ($\Sigma_{tot}$) | % by wt. | 100.000 |

-continued

| Example C6 (comparative example) | | |
|---|---|---|
| Calculated data for the composition | | |
| Sum of binders, based on $\Sigma_{tot}$ | % by wt. | 55 |
| Proportion of vinyl groups of binder 2 | % by wt. | 7 |
| Sum of plasticizers, based on $\Sigma_{tot}$ | % by wt. | 32 |
| Sum of all vinyl groups, based on $\Sigma_{tot}$ | % by wt. | 18 |
| Components of the laminate | | |
| Substrate | 175 μm | PET film: Melinex ® 740 |
| Substrate coating | 7 μm | Adhesive coating containing UV absorber |
| Photopolymerizable layer | 980 μm | According to composition |
| Cover sheet | 125 μm | PET film: Lumirror ® X 43 |
| Substrate of cover sheet | 3 μm | Macromelt ® 6900 + Joncryl ® 586 |
| Total layer thickness (with cover element) | 1290 μm | |
| Plate layer thickness (without cover element) | 1140 μm | |
| Anisotropy factor AF | | 1.0 |

The laminate obtained was converted into at least 10 plates measuring 60×40 cm and stored away from light for 1 week at 22° C. before the further processing.

EXAMPLE C7

Comparative Example

Binder Based on SIS

A flexographic printing element of the following composition/structure was produced analogously to example 1 by means of an extrusion process:

| Example C7 (comparative example) | | |
|---|---|---|
| Composition | | |
| Kraton ® D-1161 (SIS block copolymer) | % by wt. | 71.950 |
| Nisso ® PB-B 1000 (plasticizer - 85% of vinyl) | % by wt. | 10.000 |
| Laromer ® HDDA | % by wt. | 7.500 |
| HDDMA | % by wt. | 7.500 |
| Lucirin ® BDK | % by wt. | 2.000 |
| Kerobit ® TBK | % by wt. | 1.000 |
| Dyes | % by wt. | 0.050 |
| Sum of starting materials ($\Sigma_{tot}$) | % by wt. | 100.000 |
| Calculated data for the composition | | |
| Sum of binders, based on $\Sigma_{tot}$ | % by wt. | 72 |
| Proportion of vinyl groups of main binder | % by wt. | 7 |
| Sum of plasticizers, based on $\Sigma_{tot}$ | % by wt. | 10 |
| Sum of all vinyl groups, based on $\Sigma_{tot}$ | % by wt. | 14 |
| Components of the laminate | | |
| Substrate | 175 μm | PET film: Melinex ® 740 |
| Substrate coating | 7 μm | Adhesive coating containing UV absorber |

| Example C7 (comparative example) | | |
|---|---|---|
| Photopolymerizable layer | 980 μm | According to composition |
| Cover sheet | 125 μm | PET film: Lumirror ® X 43 |
| Substrate of cover sheet | 3 μm | Macromelt ® 6900 + Joncryl ® 586 |
| Total layer thickness (with cover element) | 1290 μm | |
| Plate layer thickness (without cover element) | 1140 μm | |
| Anisotropy factor AF | | 1.0 |

The laminate obtained was converted into at least 10 plates measuring 60×40 cm and stored away from light for 1 week at 22° C. before the further processing.

EXAMPLE 1-A

The flexographic printing element from example 1 was tested by the method customary according to the prior art, in order to determine the optimum washout rate and uniform preexposure time.

For this purpose, about 20×10 cm pieces of the flexographic printing element were first washed out at different washout rates in the developer liquid with the aid of the washout unit, without preexposure, and were then dried.

The washout rate $v_{opt}$ (in mm/min) at which the relief height was 800 μm was determined. This corresponds, at a printing plate thickness of 1 140 μm, to the generally required relief height of about 700 μm plus 100 μm safety margin.

A new plate of the plate to be tested was produced by effecting preexposure in divided fields from the back with increasing exposure times. The preexposure times serving for evaluation and the arrangement thereof on the printing plate to be tested are shown in the drawing below.

| 120 s | 60 s | 40 s | 30 s | 0 s | 5 s | 10 s | 15 s | 20 s |

After the preexposed printing plate had been washed out in the developer liquid and dried until the required layer thickness of 1 140 μm had been achieved, the preexposure time at which the desired relief height of 700 μm is reached was determined by plotting the relief height against the preexposure time.

Using the values for preexposure time and washout rate determined in this manner, the flexographic printing element from example 1 was preexposed with the aid of a test negative as described above, exposed imagewise, washed out, dried, and evaluated by means of the test criteria.

EXAMPLES 2-A AND COMPARATIVE EXAMPLES C3-A TO C7-A

The flexographic printing elements from example 2 and comparative examples C3 to C7 were exposed imagewise with the aid of test negatives, washed out, dried and evaluated analogously to example 1-A. The results of the evaluation are listed in table 1 below for all examples and comparative examples.

TABLE 1

List of results from examples and comparative examples on development by means of a developer liquid

| | | Example No. | | | | | | |
|---|---|---|---|---|---|---|---|---|
| | | 1 | 2 | C3 | C4 | C5 | C6 | C7 |
| Data for the composition | | | | | | | | |
| Main binder | | v-SBS | v-SBS | v-SBS | v-SBS | SBS | SBS | SIS |
| Sum of binders | % by wt. | 45 | 48 | 52 | 51 | 48 | 55 | 72 |
| Proportion of vinyl groups of main binder | % by wt. | 28 | 28 | 28 | 28 | 7 | 7 | 7 |
| Proportion of vinyl groups of binder 2 | % by wt. | | 7 | | 7 | 7 | | |
| Sum of plasticizers | % by wt. | 42 | 39 | 36 | 36 | 39 | 32 | 10 |
| Sum of all vinyl groups | % by wt. | 22 | 28 | 19 | 19 | 12 | 18 | 14 |
| Anisotropy factor AF | | 1.0 | 1.1 | 4.2 | 1.4 | 1.1 | 1.0 | 1.0 |

| | | Development by means of developer liquid: Example No. | | | | | | |
|---|---|---|---|---|---|---|---|---|
| | | 1-A | 2-A | C3-A | C4-A | C5-A | C6-A | C7-A |
| Preexposure time | sec | 15 | 15 | 15 | 15 | 15 | 20 | 20 |
| Washout rate | mm/min | 140 | 140 | 140 | 140 | 140 | 160 | 120 |
| Postexposure time UVA | min | 10 | 10 | 10 | 10 | 10 | 10 | 10 |
| Postexposure time UVC | min | 20 | 20 | 20 | 20 | 20 | 20 | 20 |
| Relief height | μm | 730 | 710 | 760 | 700 | 740 | 670 | 680 |
| Mechanical hardness (DIN 53505) | °Shore A | 50 | 61 | 66 | 56 | 45 | 63 | |
| LEL | min | 8 | 8 | 6 | 8 | 10 | 8 | 10 |
| UEL | min | >18 | >18 | >18 | >18 | >18 | >18 | >18 |
| ELAT (exposure latitude) | min | >+10 | >+10 | >+12 | >+10 | >+8 | >+10 | >+8 |

EXAMPLES 1-B, 2-B AND COMPARATIVE EXAMPLES C3-B TO C7-B

The flexographic printing elements from examples 1 and 2 and comparative examples C3 to C7 were processed thermally as described above. The processing parameters used and results of the evaluation are shown in table 2 below for all examples.

As shown in table 1, all flexographic printing elements are suitable for conventional processing with developer liquids. Under comparable processing conditions, flexographic printing elements which have a sufficiently large exposure latitude are obtained.

On thermal processing (cf. table 2), however, only the novel flexographic printing elements give printing plates having an exposure latitude of ≧0. Such flexographic printing

TABLE 2

List of results from examples and comparative examples on thermal development.

| | | Example No. | | | | | | |
|---|---|---|---|---|---|---|---|---|
| | | 1 | 2 | C3 | C4 | C5 | C6 | C7 |
| Data for the composition | | | | | | | | |
| Main binder | | v-SBS | v-SBS | v-SBS | v-SBS | SBS | SBS | SIS |
| Sum of binders | % by wt. | 45 | 48 | 52 | 51 | 48 | 55 | 72 |
| Proportion of vinyl groups of main binder | % by wt. | 28 | 28 | 28 | 28 | 7 | 7 | 7 |
| Proportion of vinyl groups of binder 2 | % by wt. | | 7 | | 7 | 7 | | |
| Sum of plasticizers | % by wt. | 42 | 39 | 36 | 36 | 39 | 32 | 10 |
| Sum of all vinyl groups | % by wt. | 22 | 28 | 19 | 19 | 12 | 18 | 14 |
| Anisotropy factor AF | | 1.0 | 1.1 | 4.2 | 1.4 | 1.1 | 1.0 | 1.0 |

| | | Thermal development: Example No. | | | | | | |
|---|---|---|---|---|---|---|---|---|
| | | 1-B | 2-B | C3-B | C4-B | C5-B | C6-B | C7-B |
| Preexposure time | sec | 15 | 15 | 15 | 15 | 15 | 20 | 20 |
| Number of processing cycles | | 10 | 10 | 10 | 10 | 10 | 10 | 10 |
| Temperature of heating roll | °C. | 163 | 163 | 163 | 163 | 163 | 163 | 163 |
| Postexposure time UVA | min | 10 | 10 | 10 | 10 | 10 | 10 | 10 |
| Postexposure time UVC | min | 20 | 20 | 20 | 20 | 20 | 20 | 20 |
| Relief height | μm | 630 | 570 | 510 | 390 | 580 | 770 | 530 |
| Mechanical hardness (DIN 53505) | °Shore A | 50 | 61 | 66 | 56 | 45 | 63 | |
| LEL | min | 8 | 10 | 8 | 8 | >18 | >18 | 10 |
| UEL | min | 10 | 10 | 4 | 2 | 8 | 10 | 2 |
| ELAT (exposure latitude) | min | +2 | 0 | −4 | −6 | <−10 | <−8 | −8 | elements can be thermally developed without problems after the imagewise exposure. In the comparative examples, the exposure latitude is negative. This means that such flexographic printing elements already have reduced relief depths in negative elements at exposure times which are necessary for the correct formation of positive elements. On printing, this leads to rapid clogging with printing ink and hence, particularly in relatively long print runs, to a low-quality, blurred printed image and a greater increase in tonal value. From time to time, the printing process has to be stopped and the plate cleaned.

In comparative examples C5-B and C6-B, correct formation of the positive elements was not even possible within an imagewise exposure time of 18 minutes. On printing, such printing plates lead to noncrisp, low-quality printed copies with breaks in the printed image, especially in the case of screens in the low tonal value range and fine line elements, e.g. small scripts.

C7-B shows that positive exposure latitude could not be obtained using an SIS plate.

We claim:

1. A process for the production of flexographic printing plates by thermal development, in which the starting material used is a photopolymerizable flexographic printing element which comprises, arranged one on top of the other, at least
    a dimensionally stable substrate,
    at least one photopolymerizable relief-forming layer, at least comprising an elastomeric binder, ethylenically unsaturated monomers, plasticizer and photoinitiator, and
    the thermal development process comprises at least the following steps:
    (a) imagewise exposure of the photopolymerizable relief-forming layer to actinic radiation to produce polymerized and unpolymerized portions of the relief-forming layer,
    (b) heating of the relief-forming layer to a temperature of from 40 to 200° C. after imagewise exposure to soften the unpolymerized portions of the relief-forming layer,
    (c) removal of the softened, unpolymerized portions of the relief-forming layer to form a printing relief,
    wherein steps (b) and (c) are performed simultaneously or sequentially (b) then (c); and
    wherein the elastomeric binder is at least one styrene/butadiene block copolymer having a molecular weight $M_w$ of from 80 000 to 250 000 g/mol and a styrene content of from 15 to 35% by weight, based on the binder, the proportion of butadiene present in 1,2-linked form being at least 15% by weight, based on the binder, and the amount of the styrene/butadiene block copolymer is from 35 to 50% by weight and that of the plasticizer is from 25 to 50% by weight, based in each case on the sum of all components of the relief-forming layer.

2. A process according to claim 1, wherein the amount of the plasticizer is from 30 to 45% by weight and that of the styrene/butadiene block copolymer is from 35 to 50% by weight, based in each case on the sum of all components of the relief-forming layer.

3. A process according to claim 1, wherein the proportion of butadiene which is present in 1,2-linked form in the polymer is at least 20% by weight, based on the binder.

4. A process according to claim 1, wherein the plasticizer is a mixture of plasticizers which comprises at least one polybutadiene oil.

5. A process according to claim 4, wherein the plasticizer mixture furthermore comprises at least one mineral oil.

6. A process according to claim 4, wherein at least 40% by weight of the butadiene units in the polybutadiene oil are incorporated in 1,2-linked form.

7. A process according to claim 1, wherein the relief-forming layer additionally comprises up to 20% by weight of at least one secondary binder.

8. A process according to claim 1, wherein the imagewise exposure (a) is carried out by positioning a mask on the flexographic printing element and effecting exposure to light through the positioned mask.

9. A process according to claim 1, wherein the flexographic printing element additionally has a digitally imageable layer and step (a) is carried out by recording imagewise on the digitally imageable layer and effecting exposure to light through the mask thus created in situ.

10. A process according to claim 9, wherein the digitally imageable mask is a mask selected from the group consisting of IR-ablative masks, inkjet masks and thermographic masks.

11. A process according to claim 9, wherein the digitally imageable layer or the residues thereof is or are removed from the relief-forming layer before process step (b).

12. A process according to claim 11, wherein the digitally imageable layer is water-soluble, and the digitally imageable layer or the residues thereof is or are removed with water or a predominantly aqueous solvent before step (b).

13. A process according to claim 1, wherein the removal of the softened, unpolymerized parts is carried out by bringing the flexographic printing element into contact with an absorbent material.

14. A process according to claim 1, wherein the removal of the softened, unpolymerized parts is carried out by processing the flexographic printing element with hot air or liquid streams under pressure.

15. A process according to claim 1, wherein the temperature in step (b) is from 60 to 160° C.

* * * * *